US011770109B2

(12) United States Patent
Hancioglu et al.

(10) Patent No.: US 11,770,109 B2
(45) Date of Patent: Sep. 26, 2023

(54) PROGRAMMABLE CHOPPING ARCHITECTURE TO REDUCE OFFSET IN AN ANALOG FRONT END

(71) Applicant: Cypress Semiconductor Corporation, San Jose, CA (US)

(72) Inventors: Erhan Hancioglu, Bothell, WA (US); Eashwar Thiagarajan, Bothell, WA (US); Eric Mann, Issaquah, WA (US); Harold Kutz, Edmonds, WA (US); Vaibhav Ramamoorthy, Bothell, WA (US); Rajiv Singh, Bothell, WA (US); Amsby Richardson, Jr., Lynnwood, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/901,654

(22) Filed: Sep. 1, 2022

(65) Prior Publication Data

US 2023/0055860 A1  Feb. 23, 2023

Related U.S. Application Data

(63) Continuation of application No. 16/913,130, filed on Jun. 26, 2020, now Pat. No. 11,437,961.

(51) Int. Cl.
*H03F 1/02* (2006.01)
*H03F 3/38* (2006.01)
*H03F 3/387* (2006.01)
*H03M 3/00* (2006.01)

(52) U.S. Cl.
CPC ............ *H03F 3/387* (2013.01); *H03M 3/458* (2013.01); *H03F 1/02* (2013.01); *H03F 2200/171* (2013.01); *H03F 2200/331* (2013.01); *H03F 2200/375* (2013.01)

(58) Field of Classification Search
CPC ...... H01Q 1/421; H01Q 1/241; H01Q 9/0407; H01Q 15/08; H01Q 15/18; H01Q 15/23; H01Q 19/06; H01Q 19/106; H01Q 21/08; H01Q 25/005; H01Q 1/243; H01Q 21/06; H04M 1/0249; H04M 1/0266; H04M 1/0277; H03F 3/217; H03F 3/2173; H03F 2200/351; H03F 3/2171
USPC ................................... 330/9, 10, 207 A, 251
See application file for complete search history.

(56) References Cited

U.S. PATENT DOCUMENTS 9,419,639 B1 *  8/2016  Hu ..................... G11C 27/024
10,848,170 B1 * 11/2020  Thiagarajan ............. H03G 3/30

* cited by examiner

*Primary Examiner* — Khanh V Nguyen

(57) ABSTRACT

An integrated circuit can include an amplifier coupled to receive an analog input signal, an anti-aliasing filter (AAF) coupled to an output of the amplifier, a buffer circuit coupled to an output of the AAF, a sigma-delta modulator configured to generate a digital data stream in response to an output of the buffer, and a plurality of chopping circuits nested within one another, including a first pair of chopping circuits having at least the amplifier disposed therebetween and configured to remove offset in the analog input signal, and a second pair of chopping circuit having at least the first pair of chopping circuits disposed therebetween. The amplifier, AAF, sigma-delta modulator, and chopping circuits can be formed with the same integrated circuit substrate. Corresponding methods and systems are also disclosed.

26 Claims, 12 Drawing Sheets

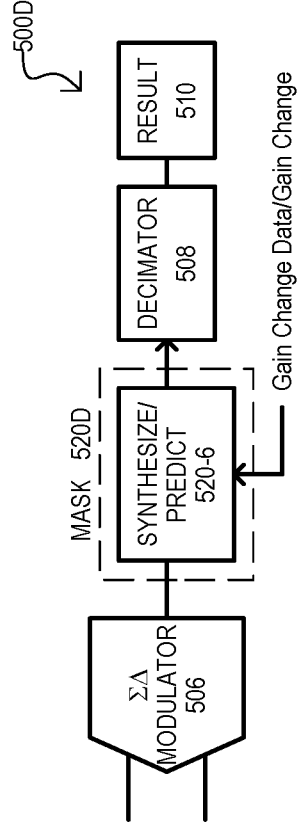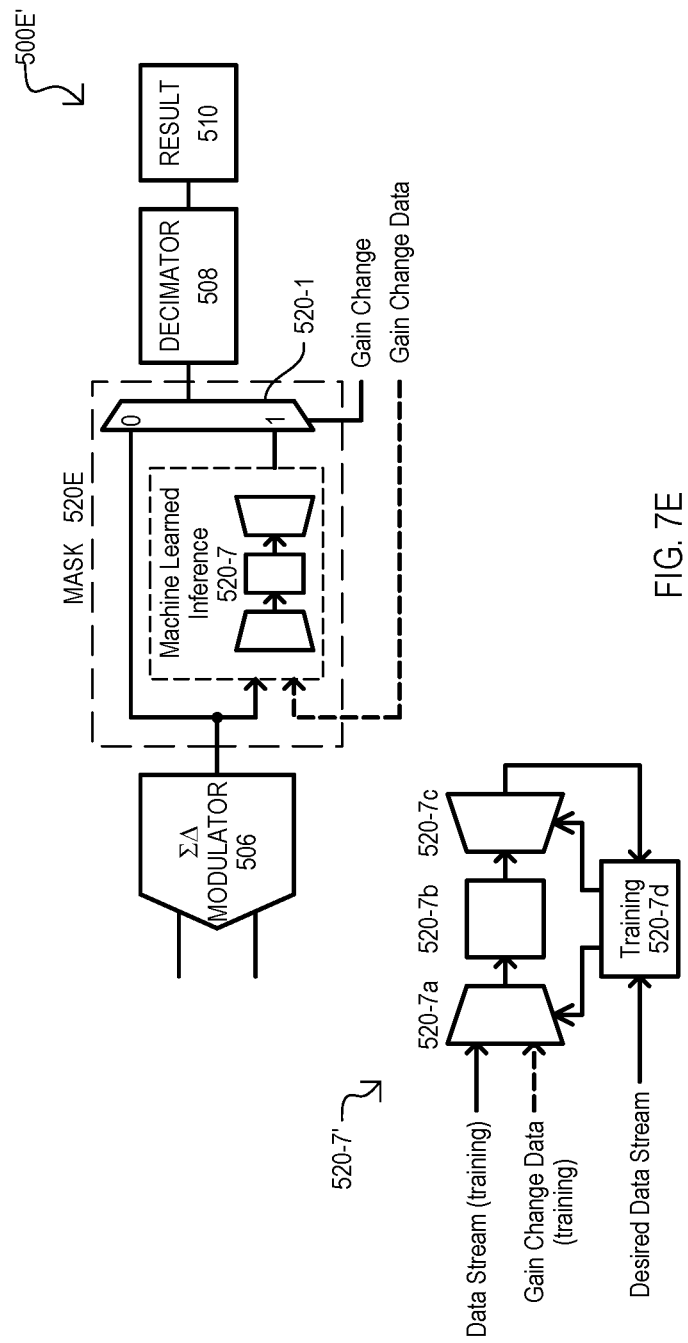

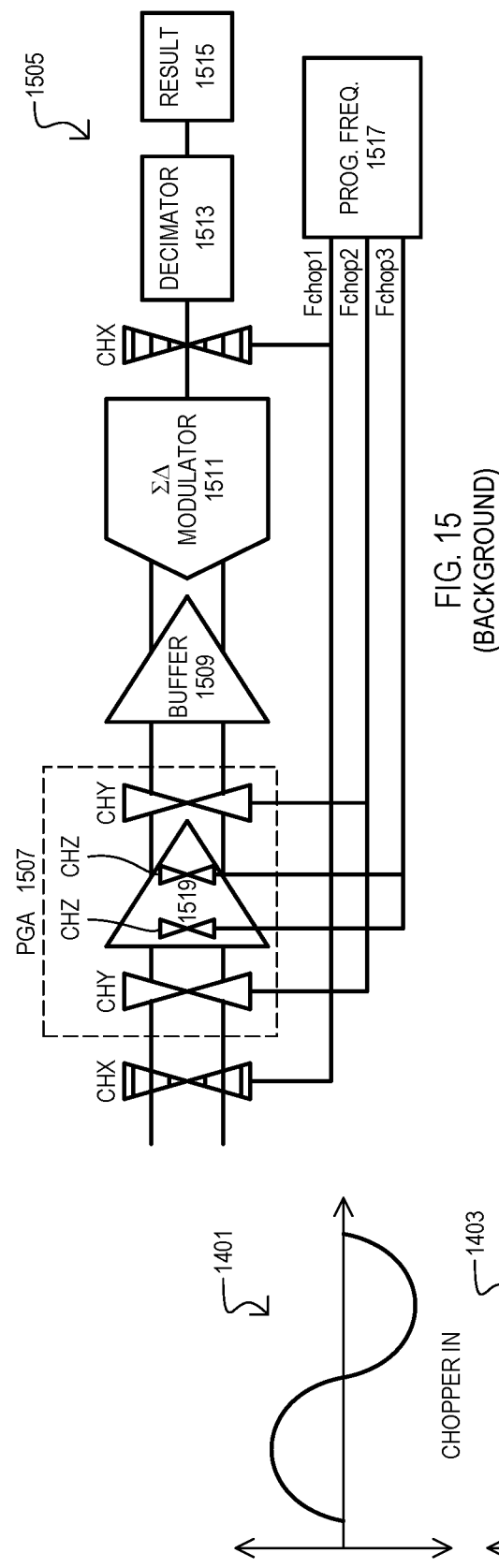
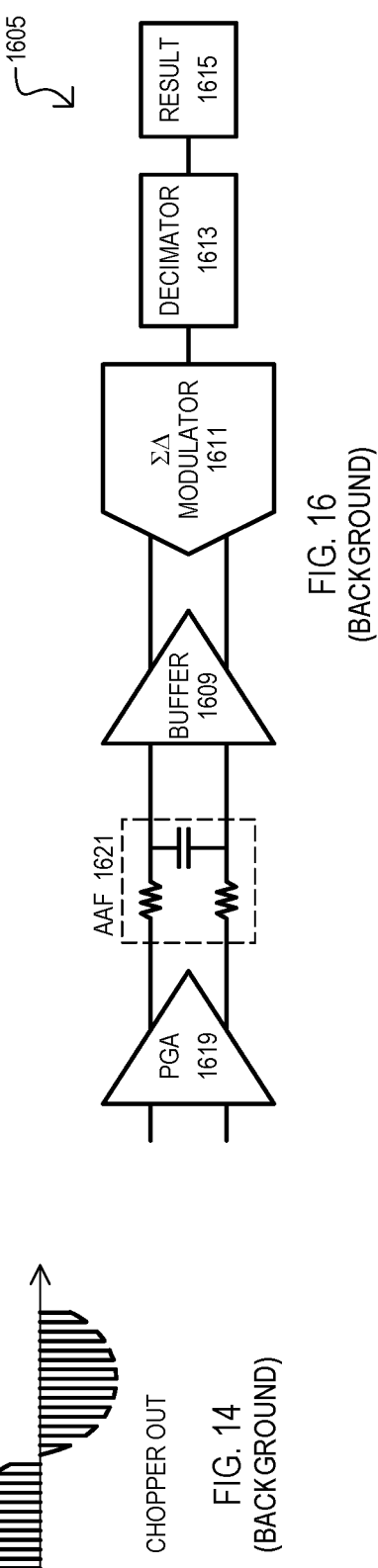
FIG. 14 (BACKGROUND)
FIG. 15 (BACKGROUND)
FIG. 16 (BACKGROUND)

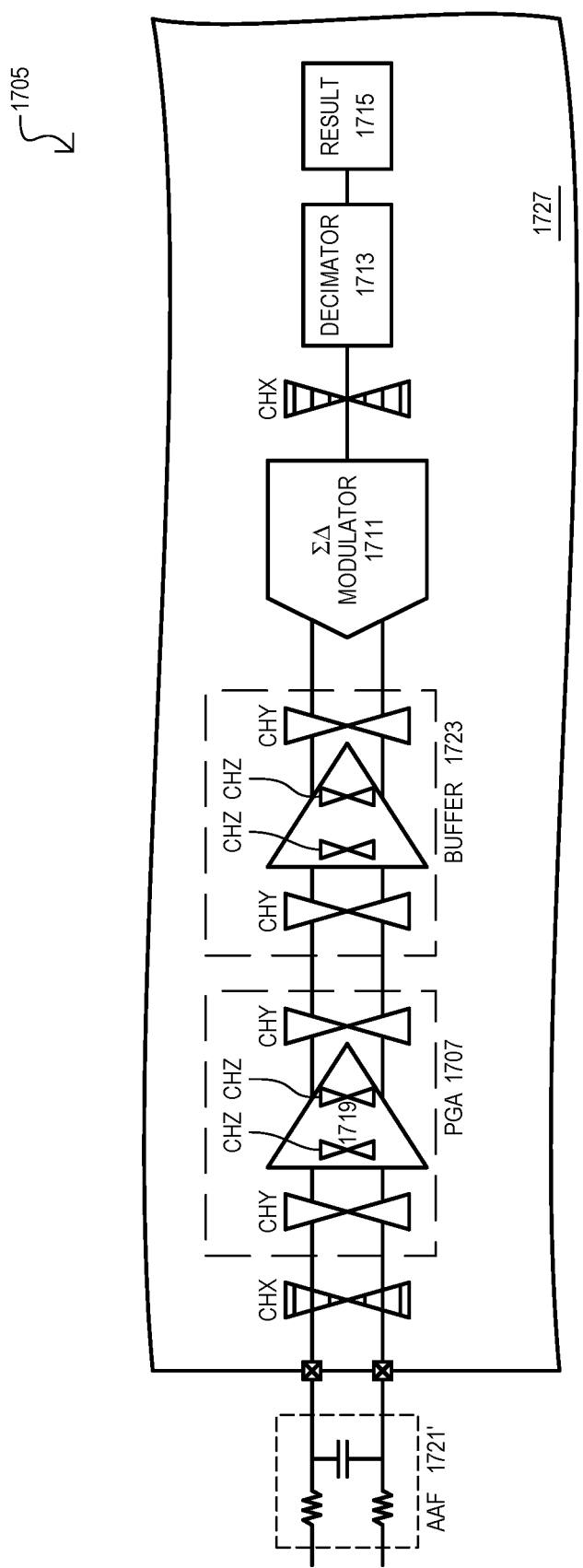
FIG. 17 (BACKGROUND)

PROGRAMMABLE CHOPPING ARCHITECTURE TO REDUCE OFFSET IN AN ANALOG FRONT END

CROSS-REFERENCE TO RELATED APPLICATIONS

This application is a continuation of U.S. application Ser. No. 16/913,130, filed Jun. 26, 2020, which is incorporated by reference herein in its entirety.

TECHNICAL FIELD

The present disclosure relates generally to analog signal processing, and more particularly to analog "front end" circuits that can process analog signals for conversion to digital values.

BACKGROUND

Analog signal processing circuits can introduce undesirable offset voltages and/or currents into an analog signal. For example, in the case of analog-to-digital converters (ADCs), an offset voltage can lead to inaccurate output values. One way to reduce offset voltages in an analog circuit can be the use of "chopper" circuits. Chopper circuits can modulate an offset voltage into a higher frequency. The higher frequency can then be filtered out with a low pass filter to eliminate or reduce the offset from a final value.

FIG. 14 shows one example of a chopper circuit operation. An analog signal 1401 input into the chopper circuit can be periodically interrupted (e.g., brought to a zero/reference value). A resulting chopper circuit output is shown as 1403.

FIG. 15 shows a conventional ADC 1505 having "nested" chopper circuits. An analog signal path can include a first chopper circuit pair CHX between an output of a sigma-delta modulator 1511 and an analog signal input. A second chopper circuit pair CHY can be nested within first chopper circuit pair CHX between inputs and outputs of a programmable gain amplifier (PGA) 1519 in a PGA section 1507. A third chopper circuit pair CHZ can be nested within the second chopper circuit pair CHY within the PGA 1519. The frequency at which chopper pairs CHX, CHY and CHZ operate can be set by programmable frequency circuit 1517.

An analog signal conditioned by chopping circuits CHX, CHY and CHZ can be provided to sigma-delta modulator 1511 (also referred to as a delta-sigma modulator) to generate a stream of digital values corresponding to an amplitude of the analog signal. A decimator 1513 can downsample the digital stream to provide a digital output result 1515. While chopping circuits can reduce offset, they can be unsuitable when integrated with other circuit sections, such as analog filters.

Analog signals received for processing can include undesirable frequency components due to noise or other effects. In addition, in the case of sigma-delta ADCs, it can be desirable to restrict an input signal frequency range to ensure optimal results for the sampling frequency used. To address such issues, conventional AFEs can include an anti-aliasing filter configured to pass the desired frequencies of an analog input signal.

FIG. 16 shows a conventional ADC 1605 having an AAF 1621 disposed between a PGA 1619 and buffer 1609. Buffer 1609 can provide a buffered and filtered analog signal to sigma-delta modulator 1611. A resulting stream of digital values can be processed by decimator 1613 to generate digital output results 1615.

Conventional ADC 1605 can have offset voltages in various stages. However, including chopping circuits to such an arrangement can have drawbacks. When an AAF bandwidth is relative small, a preceding chopping circuit can have unmatched settling for positive and negative outputs (with respect to analog ground). The sigma-delta modulator would then sample the unmatched signal, which would introduce an offset error into the final digital result.

FIG. 17 shows another conventional ADC 1705 that can include an AAF and chopping circuits. ADC 1705 can include chopping circuit pairs CHX, CHY, CHz, a PGA section 1707, a buffer section 1723 having nested chopping. ADC 1705 also includes a sigma-delta modulator 1711, a decimator 1713, and result section 1715. Such circuit elements can be formed with an integrated circuit substrate 1727. ADC 1705 also includes an AAF 1721' formed with circuit elements external to the integrated circuit (i.e., off chip components). While conventional ADC 1705 can provide AAF filtering with chopping circuits, such an approach can be undesirably high in component cost and size.

It would be desirable to arrive at some way of providing an AFE that can provide both input signal filtering and low offset voltages.

BRIEF DESCRIPTION OF THE DRAWINGS

FIGS. 7A to 7E are diagrams showing various masking circuits according to embodiments.

FIG. 14 is a diagram showing a chopping operation.

FIG. 15 is a block diagram of a conventional ADC.

FIG. 16 is a block diagram of another conventional ADC.

FIG. 17 is a block diagram of another conventional ADC.

DETAILED DESCRIPTION

According to embodiments an analog front end (AFE) that converts analog signals into a digital data stream can include both an analog anti-aliasing filter (AAF) and chopping circuits to reduce any offset voltage in the system. In some embodiments, AAF components can reconfigured operations of the chopping circuit to improve settling symmetry in the resulting chopped analog signal.

In some embodiments, an AFE can include nested chopping circuits. A first chopping circuit pair can be positioned at the front and end of the analog signal path. One or more other pairs of chopping circuits can be positioned within the first chopping circuit pair, nested around circuit components (e.g., amplifiers) that can generate offset.

In some embodiments, portions of the digital data stream that can be unsettled due to chopping operations can be masked. Such masking can include substituting possibly unsettled data stream values with previously stored data stream values.

Figure 1:
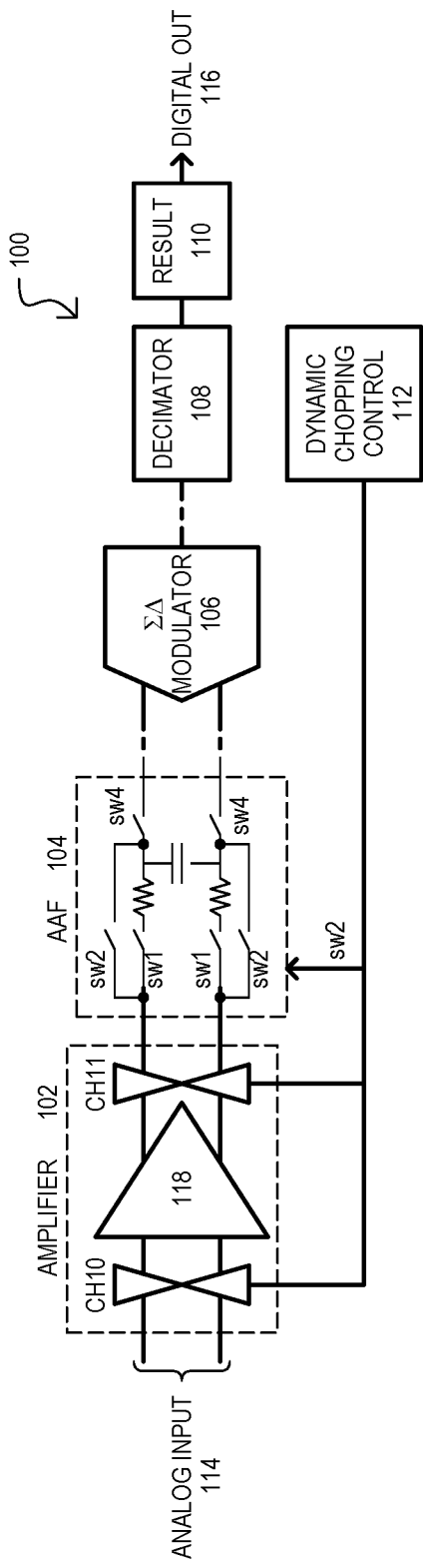
FIG. 1 is a block diagram of an analog-to-digital converter (ADC) according to an embodiment.

FIG. 1 is a block diagram of an ADC 100 according to an embodiment. An ADC 100 can have an AFE formed by an amplifier section 102, an anti-aliasing filter (AAF) 104, and a sigma-delta modulator (hereinafter referred to as a "modulator") 106. ADC 100 can also include decimator 108 and a result section 110. According to embodiments, an AFE can include one or more pairs of chopping circuits formed therein. In the embodiment of FIG. 1, a chopping circuit pair CH10/11 is shown formed in the amplifier section 102 between the input and output of an amplifier 118. However, in other embodiments, a chopping circuit pair can be situated elsewhere in the AFE.

According to embodiments, while chopping circuits CH10/11 are active (e.g., interrupting the analog signal), switch elements in AAF 104 can reconfigure AAF 104 to have a greater bandwidth. In the particular embodiment shown, when chopping circuits are not active, switch elements sw1 and sw4 can be closed and switch elements sw2 and sw3 can be open, When chopping circuits CH10/11 are active, switch elements sw1 can open and switch elements sw2 can close, bypassing the input resistance of the AAF 104.

A dynamic chopping control circuit 112 can generate signals for controlling chopping circuits CH10/11 and reconfiguring switch elements of AAF 104 during chopping operations.

An analog signal output from AFE 104 can be modulated by modulator 106. A resulting stream of digital values can be received by decimator 108, which can generate ADC digital conversion results 110, which can be provided as a digital output values 116.

In this way, an AFE can include an AAF to filter analog input signals, as well as chopping circuits to reduce or eliminate offset voltages that can arise in the AFE.

In some embodiments, ADC 100 can be part of the same integrated circuit. That is, all circuit components, including AAF 102 can be formed with a same integrated circuit substrate.

Figure 2:
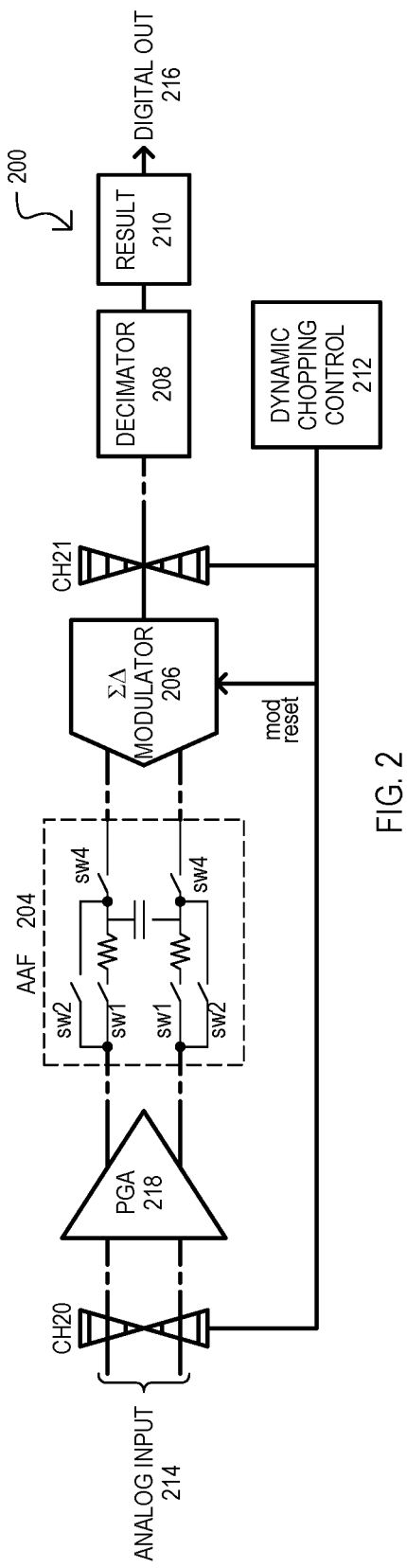
FIG. 2 is a block diagram of an ADC according to another embodiment.

FIG. 2 is a block diagram of an ADC 200 according to another embodiment. An ADC 200 can have an AFE formed by an amplifier, which in the embodiment shown, can be a programmable gain amplifier (PGA) 218, AAF 204, and modulator 206. AFE can include chopping circuit pair CH20/21, which in the embodiment shown can be disposed an input of PGA 218 and output of modulator 306. ADC 200 can also include decimator 208 and a result section 220.

According to embodiments, while chopping circuits CH20/22 are active, modulator 206 can be reset. Such an action can help ensure a modulator 206 remains stable. A modulator 206 can be reset in any suitable fashion. As but one of many possible examples, a modulator 206 can include one or more integrator stages, and integrating and feedback capacitors in such stages can be reset.

A dynamic chopping control circuit 222 can generate signals for controlling chopping circuits CH20/22 and generating signal(s) (mod reset) for resetting modulator 206.

In this way, a modulator operation can be reset while chopping circuits are active.

In some embodiments, ADC 200 can be part of the same integrated circuit.

Figure 3:
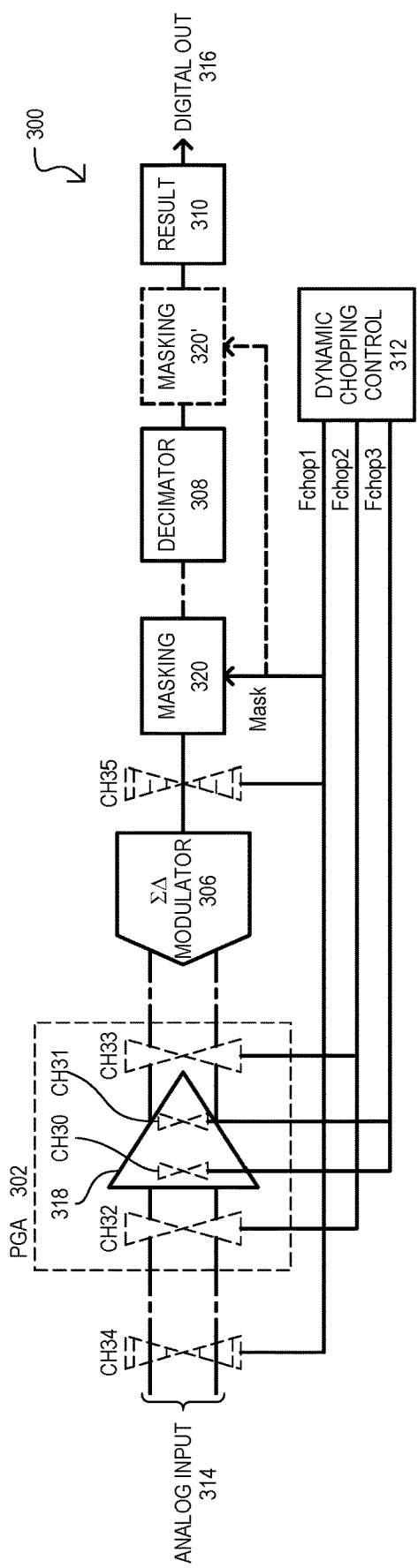
FIG. 3 is a block diagram of an ADC according to a further embodiment.

FIG. 3 is a block diagram of an ADC 300 according to another embodiment. An ADC 300 can have an AFE formed by a PGA section 302, modulator 306, and multiple nested chopping circuit pairs CH30/31, CH32/33 and CH34/35. ADC 300 can also include a masking circuit 320, decimator 308 and a result section 330.

A masking circuit (320 and/or 320') can mask portions of a data stream output from modulator 306 during chopping operations by one or more chopping circuits. In the event a chopping operation generates unsettled data values, and such data values are reflected in the data stream generated by modulator 306, such values in the data stream can be masked with alternative by data values. Masking data values can include replacing or altering the digital stream generated by the modulator 306 corresponding to possibly unsettled data (i.e., chopping operations). In FIG. 3, a masking circuit 320 can be activated in response to chopping operation by chopping circuit pair CH34/35 (at a frequency Fchop1). However, in alternate embodiments, masking circuits 320 can be activated in response to any chopping operation that can result in unsettled data.

A masking circuit (320 and/or 320') can be located at various locations in the conversion path. As shown by masking circuit 320, a masking circuit can mask data values as they are output from modulator 306. However, as shown by masking circuit 320', in other embodiments, masking can be performed at a "back-end" of the conversion path, masking data values following digital processing steps, including but not limited to digital filtering and/or decimation.

According to embodiments, an AFE can have nested chopping. In a nested chopping arrangement, circuits that can introduce offset can include an internal chopping circuit pair. The internal chopping circuit pair can be nested within an external chopping circuit pair. Further, external chopping circuit pairs can be nested within a channel chopping circuit pair which can encompass the analog signal path. Such differing levels of chopping circuits can operate an increasingly faster frequencies as one moves inward from the channel chopping circuits to the internal chopping circuits.

In FIG. 3, chopping circuits CH30/31 can be internal chopping circuits for amplifier 318, and can operate at a frequency Fchop3. Chopping circuits CH32/33 can be external chopping circuits to amplifier 318 and can operate at a frequency Fchop2. Chopping circuits CH34/35 can be channel chopping circuits and can operate at a frequency Fchop1. In some embodiments, Fchop3>Fchop2>Fchop1. The various chopping frequencies can be generated by dynamic chopping control circuits 312. Any or all of the chopping frequencies (Fchop1-3) can be programmable.

In this way, embodiments can include a masking circuit which can mask data stream values corresponding to one or more chopping operations in the analog signal processing path. Further, the analog signal path can include nested chopping circuits.

While embodiments can include AFEs that compensate for possible adverse effects of chopping circuits, embodiments can also include AFEs that can compensate for the adverse effects of switching between analog input signals.

Figure 4:
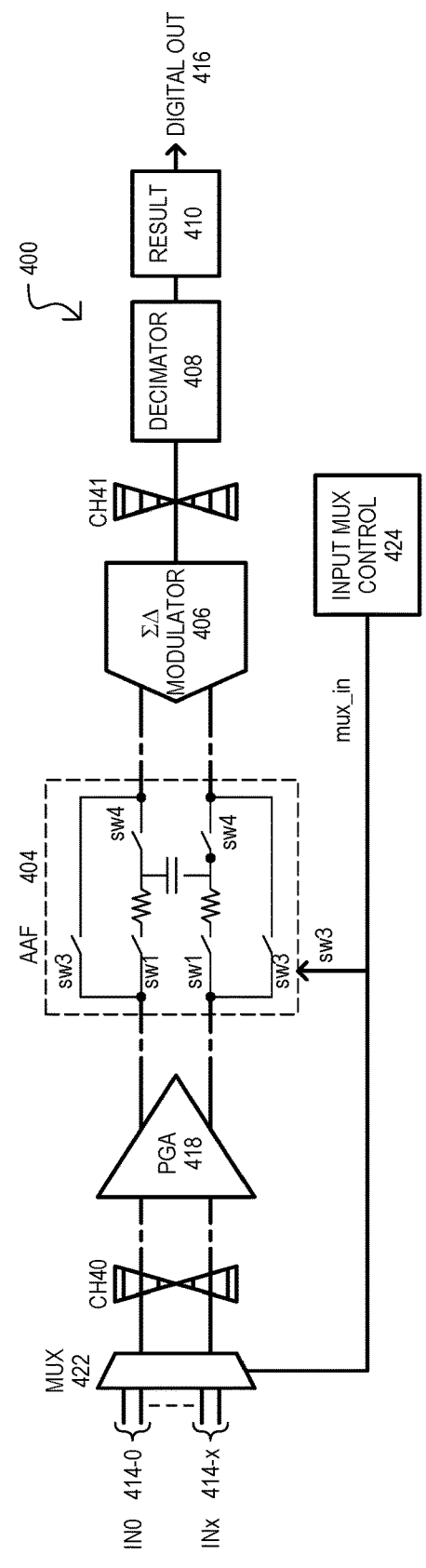
FIG. 4 is a block diagram of an ADC according to a further embodiment.

FIG. 4 is a block diagram of an ADC 400 according to another embodiment. An ADC 400 can have an input multiplexer (MUX) 422, one or more chopping circuits (two shown as CH40/41), a PGA 418, AAF 404 and modulator 406. ADC 400 can also include decimator 408 and a result section 410.

An input MUX 422 can selectively switch between two or more analog input signals (404-0 to 414-x). Because the analog input signals (404-0 to 414-x) can be at different levels, an analog filter (e.g., AAF) may take some time to settle when switching between analog input signals. According to embodiments, when switching to a new analog input signal, switch elements within AAF 404 can bypass filter elements, enabling the new signal level to be processed quickly. In the embodiment of FIG. 4, when switching between analog input signals (404-0 to 414-x) switch elements sw1 and sw4 can be open, while switch elements sw3 are closed.

Signals for controlling input MUX 422 and switch elements in AAF 404 can be generated by an input MUX control circuit 424.

Figure 5:
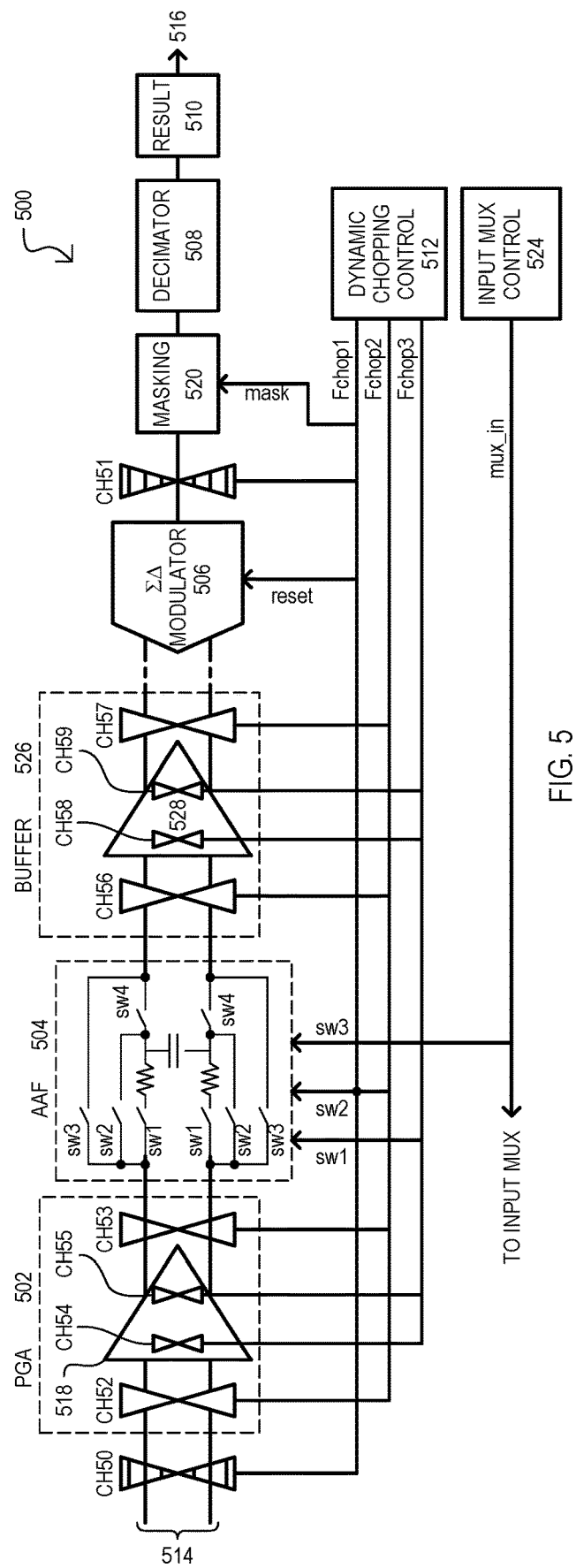
FIG. 5 is a detailed block diagram of an ADC according to an embodiment.

FIG. 5 is a more detailed block diagram of an ADC 500 according to another embodiment. ADC 500 can be one implementation of any of those shown in FIGS. 1 to 4. ADC 500 can include a PGA section 502, AAF 504, buffer section 526, modulator 506, masking circuit 520, decimator 508 and result section 510.

ADC 500 can also include nested chopping circuits. PGA section 502 can include internal chopping circuits CH54/55 nested within external chopping circuits CH52/53. Buffer section 526 can include internal chopping circuits CH58/59 nested within external chopping circuits CH56/57. These chopping circuits can be nested within channel chopping circuits CH50/51.

Chopping circuits (CH50-59) can be controlled by signals from a dynamic chopping control circuit 512. In the embodiment shown, internal chopping circuits CH54/55 and CH58/59 can be controlled by a signal Fchop3. External chopping circuits CH52/53 and CH56/57 can be controlled by a signal Fchop2. Channel chopping circuits Ch50/51 can be controlled by a signal Fchop1. In some embodiments, signals Fchop1-3 can be periodic and have frequencies in which Fchop3>Fchop2>Fchop1. However, in other embodiments, chopping circuits can be controlled individually or in different groupings.

AAF 504 can be reconfigured in response to activation of chopping circuits by changing the state of switching elements sw1 to sw4. Switch elements sw1 can be controlled in response to signal Fchop3. Switch elements sw2 can be controlled in response to signals Fchop1 (and Fchop2). Switch elements s3 can be controlled in response to a signal mux in generated by an input MUX control circuit 524. Particular configurations for AAF 504 are described in more detail with reference to FIGS. 6A to 6D.

Modulator 506 can be reset in response to signal Fchop1 as described herein and equivalents.

Masking circuit 520 can be activated in response to signal Fchop1. Possible masking circuits will be described in more detail with reference to FIGS. 7A to 7C.

FIGS. 6A to 6D are diagrams showing a portion of an ADC 500' having various configurations for switch elements in an AAF 504.

Figure 6A:
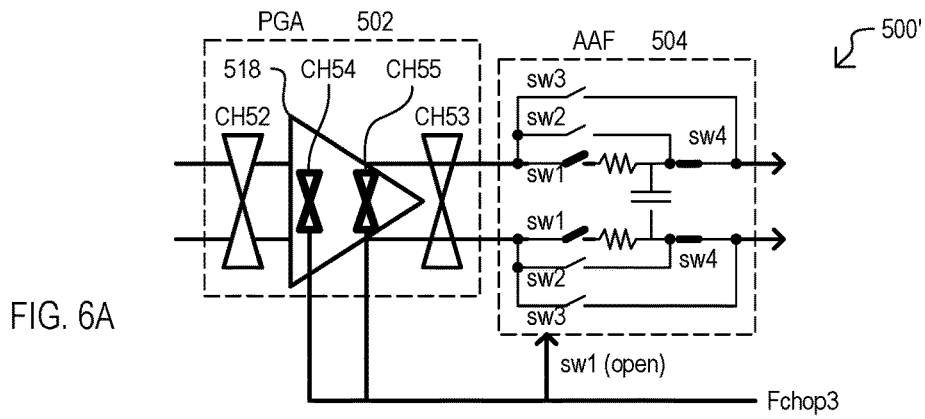
FIGS. 6A to 6D are diagrams showing various anti-aliasing filter (AAF) configurations according to embodiments.

FIG. 6A show an AAF 504 configuration when PGA internal chopping circuits CH54/55 are active. Switch elements sw1 can open, preventing unwanted analog signal effects (e.g., glitches) from propagating out of the AAF 504. Switch elements sw2 and sw3 can already be open.

Figure 6B:
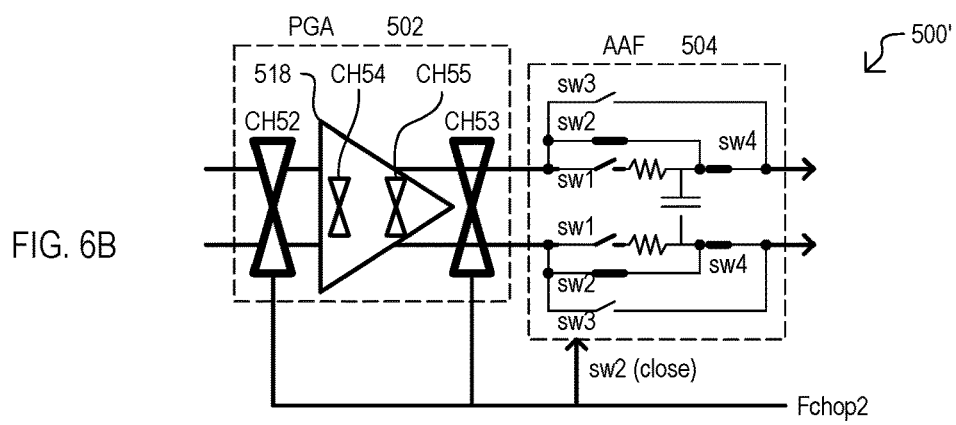

FIG. 6B show an AAF 504 configuration when PGA external chopping circuits CH52/53 are active. Switch elements sw2 can close and switch elements sw1 can open. This can improve settling symmetry and increase the bandwidth of AAF 504. Switch elements sw3 can already be open.

Figure 6C:
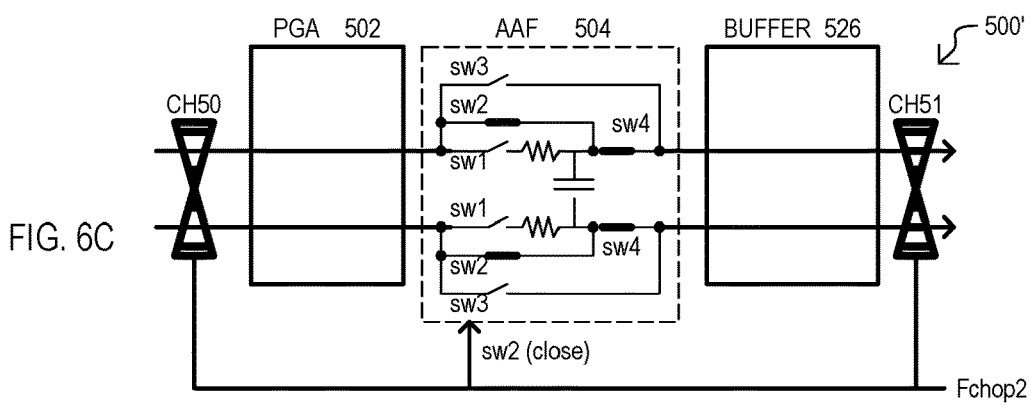

FIG. 6C show an AAF 504 configuration when channel chopping circuits CH50/51 are active. Switch elements sw2 can briefly close and switch elements sw1 can open, bypassing the input resistance of AAF 504. This can improve settling speed of the analog signal.

Figure 6D:
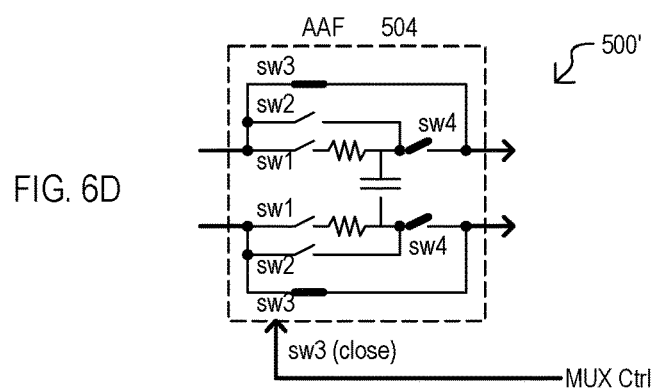

FIG. 6D shows an AAF 504 configuration when switching from one analog input signal to another. Switch elements sw3 can close and switch elements sw1, sw2 and sw4 can be open. This can essentially bypass filter element of the AAF 504 allowing the new analog signal to be rapidly output from AAF 504.

FIGS. 7A to 7E are diagrams showing masking circuits that can be included in an ADC like that of FIG. 5 according to embodiments.

Figure 7A:
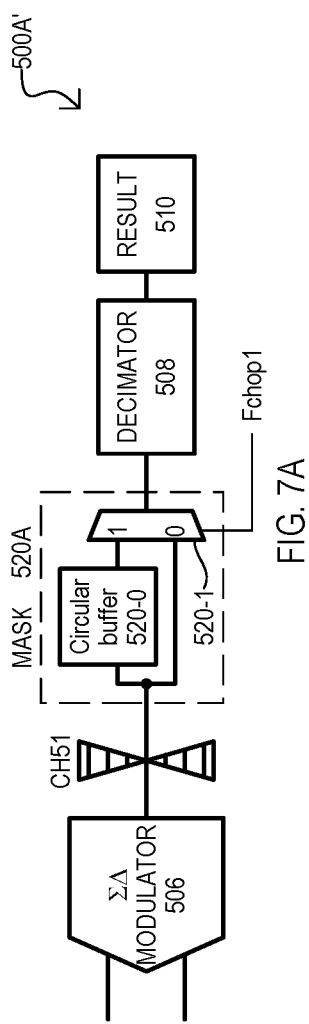

FIG. 7A shows a portion of ADC 500A' in which a mask circuit 520A can include a circular buffer 520-0 and data MUX 520-1. In operation, a stream of digital values can be output from modulator 506. While a corresponding chopping circuit is inactive, data MUX 520-1 outputs the data stream received at input "0". At the same time, circular buffer 520-0 can store a running set of streamed data values which can be applied at input "1". In this way, data MUX input "1" will receive a delayed version of the data stream received at input "0". When the corresponding chopping circuit is active, data MUX 520-1 can output the data values from circular buffer 520-0. Such stored data values will mask the data stream with old data values, preventing data stream values corresponding to unsettled analog signal levels from propagating to decimator 508 for conversion to output digital values. In some embodiments, circular buffer 520-0 can be a first-in-first-out (FIFO) memory. In some embodiments, a size (e.g., depth) of circular buffer can be programmable and/or can be changed on-the-fly.

Figure 7B:
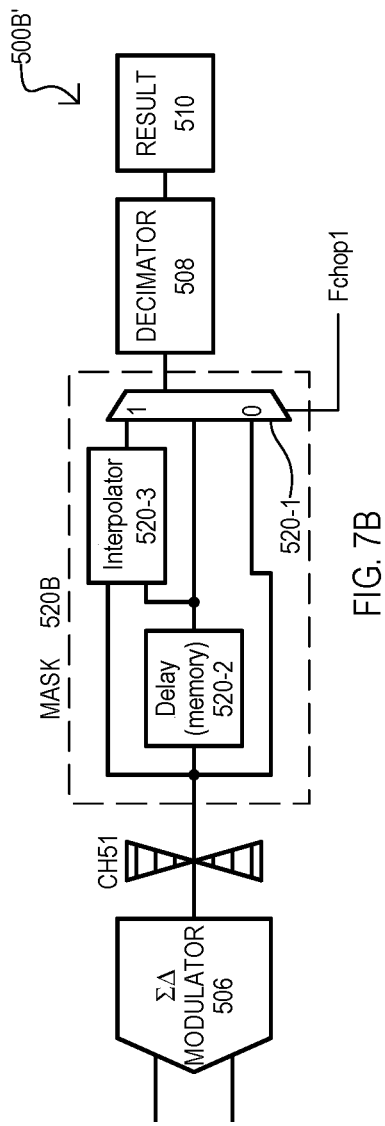

FIG. 7B shows a portion of ADC 500B' in which a mask circuit 520B can include a data MUX 520-1, delay stage 520-2 and interpolating circuit 520-3. While a corresponding chopping circuit is inactive, data MUX 520-1 outputs the data stream received at input "0". At the same time, interpolation circuit 520-3 can generate a stream of interpolated data values generated from the current data stream and that stored by delay stage 520-2. When the corresponding chopping circuit is active, data MUX 520-1 can output the interpolated data stream values. In some embodiments, a delay value for delay stage 520-2 be programmable and/or can be changed on-the-fly.

Figure 7C:
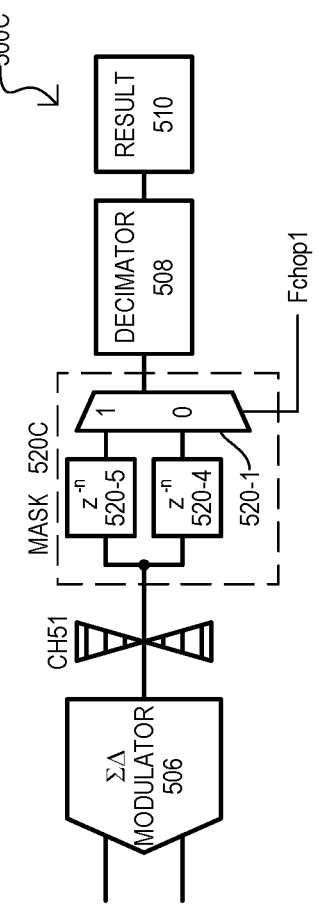

FIG. 7C shows a portion of ADC 500C' in which a mask circuit 520C can include a data MUX 520-1, a first delay element 520-4 and a second delay element 520-5. Delay element 520-5 can have a same delay as 520-4. However, in alternate embodiments, such delays can be different. While a corresponding chopping circuit is inactive, data MUX 520-1 outputs the data stream received at input "0" which is delayed by first delay element 520-4. When the corresponding chopping circuit is active, data MUX 520-1 can output the data stream received at input "1" which is delayed by second delay element 520-5. In some embodiments, a delay value for second delay element 520-5 and/or 520-4 can be programmable and/or can be changed on-the-fly.

FIG. 7D shows a portion of ADC 500D' in which a mask circuit 520D can include a synthesize circuit 520-6. Synthesize circuit 520-6 can synthesize data stream values in response to the activation of one or more chopper circuits. Absent activation of the corresponding chopper circuit(s), synthesize circuit 520-6 can output the data stream from modulator 506. In some embodiments, a synthesize circuit 520-6 can include a look-up table, or the like, to generate synthesized data stream values in response to data stream values output from modulator 506.

FIG. 7E shows a portion of ADC 700E in which a mask circuit 520E can include a machine learning (ML) engine 520-7 and MUX 520-1. ML engine 520-7 can include a machine learning inference engine trained to generate masking (e.g., corrected) data stream values from data stream values that include undesirable effects, such as those resulting from a chopping operations. Absent activation of designated chopper circuits, data MUX 520-1 outputs the data stream received at input "0" (i.e., the output of modulator 506). In the event designated chopper circuits are activated, data MUX 520-1 can output data stream values from the ML engine 520-7.

An ML engine 520-7 can take any suitable form. FIG. 7E shows one example of an ML engine 520-7' that can be included in embodiments. ML engine 520-7' is shown in a training configuration. When trained, an ML engine 520-7' can include an encoder 520-7a, latent space 520-7b, a decoder 520-7c, and a training agent 520-7d. Data stream values output during chopping operations (Data Stream (training)) can be applied to an encoder 520-7a, which can encode such values into a latent space 520-7b. Latent space values 520-b can be decoded by decoder 520-7c to generate inferred data stream values. A training agent 520-7d can compare inferred data stream values with desired data stream values (e.g., response without unwanted errors/artifacts). Based on such comparisons, training agent 520-7d can revise encoder 520-7a and/or decoder 520-7c. In some embodiments, encoder 520-7a and/or decoder 520-7c can include an artificial neural network, with neural weights adjusted by training agent 520-7d.

In some embodiments, the ADC shown in FIGS. 5 to 7C can be formed in a single integrated circuit. For example, all circuit elements of the ADC can be formed with a same semiconductor substrate, including an analog filter (e.g., AAF). This is in contrast to conventional approaches that form analog filters with off chip components.

Figure 8:
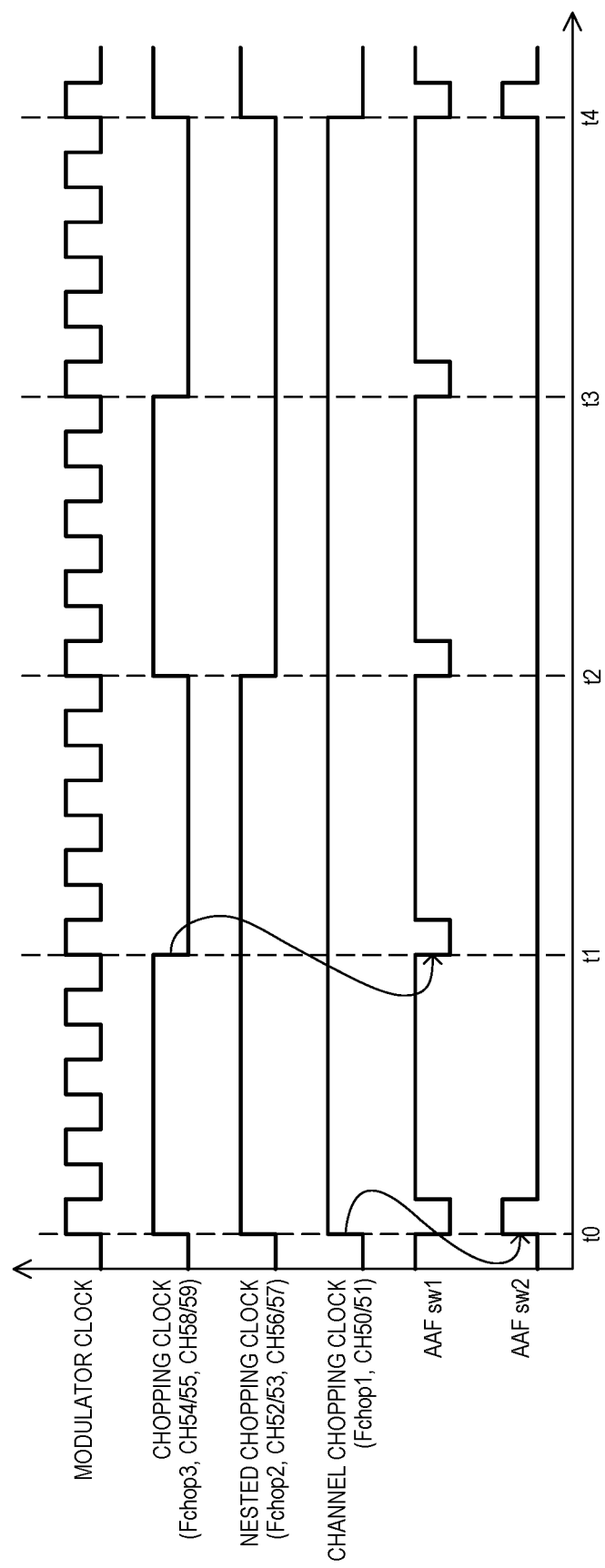
FIG. 8 is a timing diagram showing chopping control signals and AAF switch element control that can be included in embodiments.

FIG. 8 is a timing diagram showing signals that can be included in an embodiment like that of FIG. 5. FIG. 8 includes the following waveforms: "MODULATOR CLOCK" which can be a sampling clock that can indicate the frequency at which sigma-delta conversions are generated by a modulator; "CHOPPING CLOCK" can be a signal used for internal chopping circuits; "NESTED CHOPPING CLOCK" can be a signal used for external chopping circuits; "CHANNEL CHOPPING CLOCK" can be a signal used for channel chopping circuits; "AAF sw1" shows the operation of switch elements sw1 within an AAF (switch elements that feed into filter resistors), where a high logic level indicates the switch is closed; and "AAF sw2" shows the operation of switch elements sw2 within an AAF (switch elements that bypass filter resistors), where a high logic level indicates the switch is closed.

In the operation shown, switch elements sw1 can be controlled in synchronism with CHOPPING CLOCK while switch elements sw2 can be controlled in synchronism with CHANNEL CHOPPING CLOCK. Further, a frequency of CHOPPING CLOCK can be greater than NESTED CHOPPING CLOCK, which can be greater than CHANNEL CHOPPING CLOCK.

It is understood that FIG. 8 is provided by way of example. According to embodiments, any of the signals shown can be programmable, including both in frequency and phase relation to any of other signals. In addition or alternatively, a control of switch elements within an AAF can also be programmable. As but two of many possible variations, switch element activation (closing or opening) can be programmed to be synchronous with any of the signals (including either or both types of transition), and a duration of a switch element activation can be programmable (i.e., how long the switch element is closed and/or opened). In some embodiments, a switch element duration can be programmed to a number of MODULATOR CLOCK half-cycles or cycles.

While the embodiments of FIGS. 1 to 8 have shown various AFE, ADCs and corresponding methods, additional methods will now be described.

Figure 9:
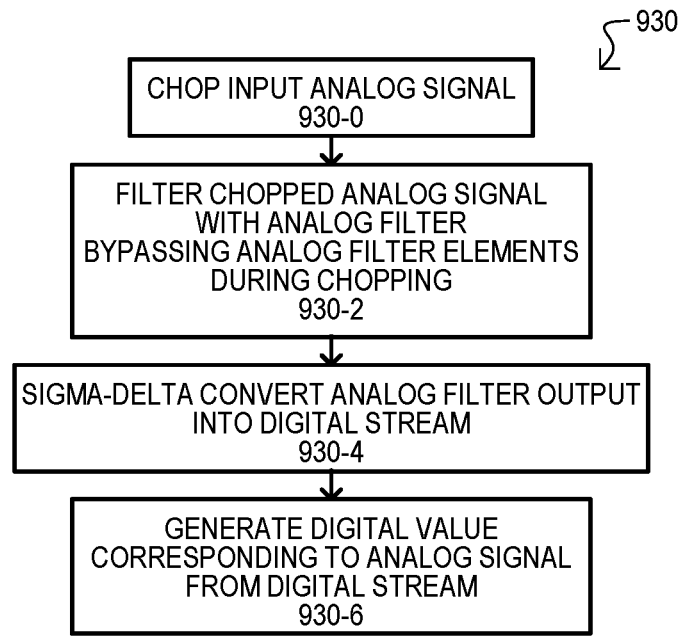
FIG. 9 is a flow diagram of a method according to an embodiment.

FIG. 9 is a flow diagram of a method 930 according to an embodiment. A method 930 can include executing chopping operations on an analog signal 930-0. Such an action can include using any suitable chopping method. In some embodiments, chopping can be used to reduce or essentially eliminate offset in an analog signal processing path.

A resulting chopped analog signal can be filtered with an analog filter. However, some or all filter elements can be bypassed during chopping 930-2. An output of the analog filter can be sigma-delta converted into a digital stream 930-4. Such an action can include any suitable conversion operation and can result in an output data stream at a sampling rate. A data stream can be multi-bit or as small as a one-bit data stream. A digital value corresponding to the analog signal can be generated from the data stream generated by the sigma-delta conversion operation 930-6.

Figure 10:
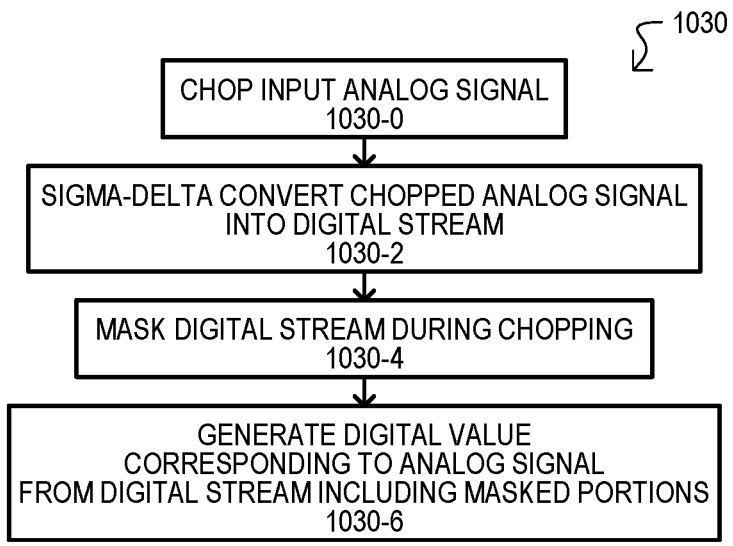
FIG. 10 is a flow diagram of a method according to another embodiment.

FIG. 10 is a flow diagram of a method 1030 according to another embodiment. A method 1030 can include executing chopping operations on an analog signal 1030-0. Such an action can include using any suitable chopping method and can reduce/eliminate offset. A resulting chopped analog signal can be sigma-delta converted into a digital stream 1030-2. Such an action can include any suitable conversion operation as described herein or an equivalent.

A digital stream can be masked during chopping 1030-4. Such an action can include replacing or altering the digital stream generated by a sigma-delta modulator during chopping. This can include portions of the data stream preceding and/or following the gain change. Replacing a data stream can include substituting data stream values for those generated during the gain change, including previously stored values. Previously stored values can be the data stream values immediately preceding those corresponding to the gain change. Altering a data stream can include performing arithmetic or logic operations on the data stream values. As but two of many possible examples, data stream values corresponding to the gain change can be averaged with previous data stream values and/or subject to an interpolation operation with respect to other data stream values, such as previously stored data stream values.

A digital value corresponding to the analog signal can be generated from the digital stream, including the masked portions of the digital stream 1030-6.

Figure 11:
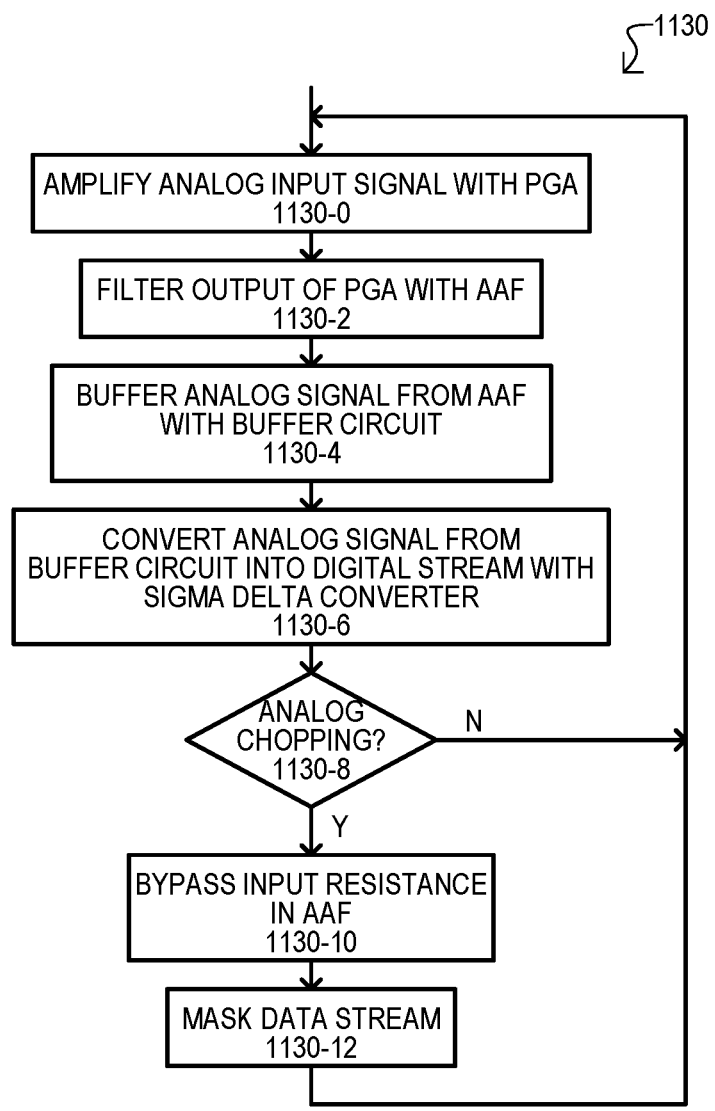
FIG. 11 is a flow diagram of a method according to a further embodiment.

FIG. 11 is a flow diagram of a method 1130 according to another embodiment. A method 1130 can include amplifying an analog signal with a PGA 1103-0. Such an action can include adjusting a gain value of the PGA if the analog signal is determined to be outside of one or more range value limit values. An output of the PGA can be filtered with an AAF 1130-2. An output of the AAF can be buffered with a buffer circuit 1130-4.

An analog signal from the buffer circuit can be sigma-delta converted into a digital stream 1130-6. Such actions can include any of those described herein and equivalents.

If one or more types of chopping are taking place in the analog signal path (Y from 1130-8), an input resistance of the AAF can be bypassed 1130-10. In addition, the data stream generated by the sigma-delta conversion can be masked 1130-12.

If the one or more types of chopping are not taking place (N from 1130-8), the analog signal can continue to be processed (return to 1130-0).

While embodiments can include ADC systems, embodiments can also include other systems.

Figure 12:
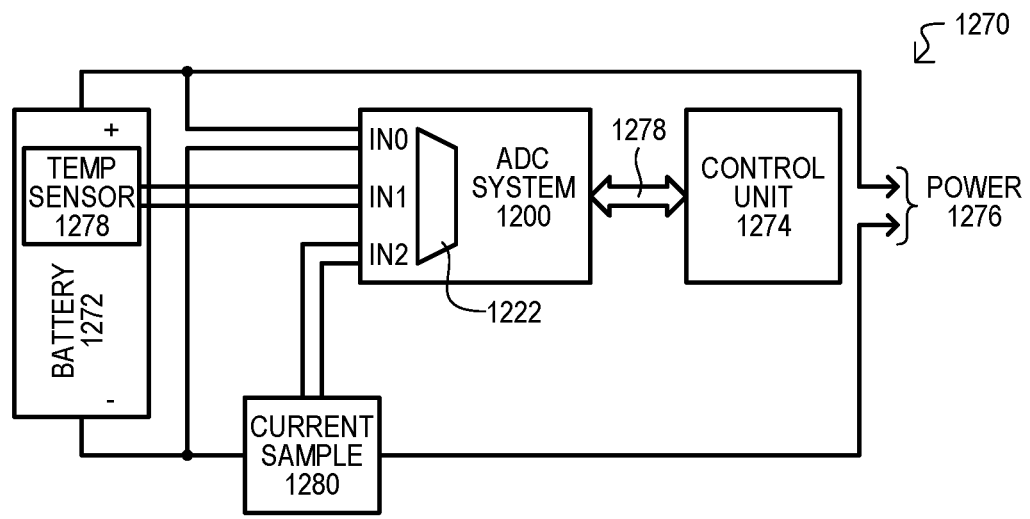
FIG. 12 is a block diagram of a system according to an embodiment.

FIG. 12 is a block diagram of a battery monitoring system 1270 according to an embodiment. A system 1270 can include a battery 1272, a control unit 1274, a current sampler 1280, and an ADC system 1200. Power 1276 can be provided from battery 1272 (i.e., battery is discharging) and/or provided to battery 1272 (i.e., battery is charging). A battery 1272 can include one or more temperature sensors 1278.

An ADC system 1200 can take the form of any of those described herein, or equivalents, and can provide accurate conversion by eliminating offset with chopping circuits, while at the same time providing analog filtering with an AAF. Such a capability can be provided on a single integrated circuit, and not require off chip circuit components.

In the embodiment shown, ADC system 1200 can generate digital values corresponding to analog signals provided by current sampler 1280. In addition or alternatively, ADC 1200 can generate digital values corresponding analog temperature readings from temperature sensor(s) 1278, as well as voltage readings for battery 1272. In some embodiments, ADC 1200 can include an input MUX 1222 for selectively connecting different analog input signals to the input of a PGA in the ADC.

Digital values generated by ADC system 1200 can be transmitted to control unit 1274 over bus system 1278.

Figure 13:
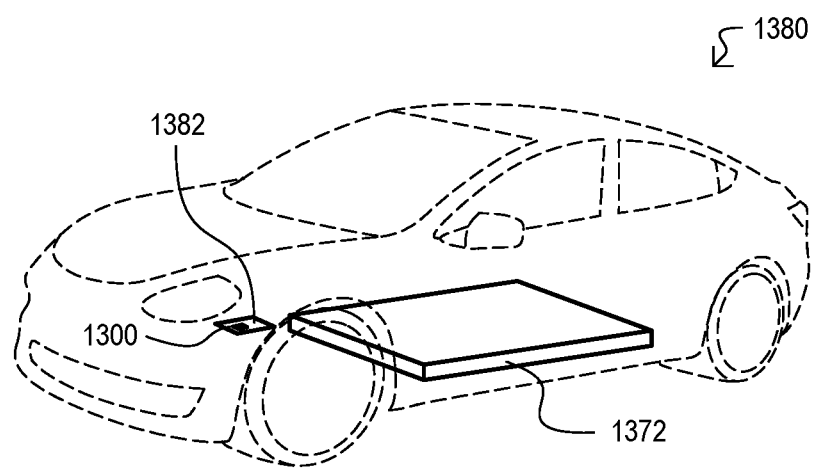
FIG. 13 is a diagram of a system according to another embodiment.

FIG. 13 is a diagram of an automobile system 1380 according to an embodiment. A system 1380 can include a battery 1372 and an intelligent battery sensor 1382. An intelligent battery sensor 1382 can include an ADC system 1300. An ADC system 1300 can take the form of any of those described herein, or equivalents, and can generate digital signals corresponding to operations of battery 1372, including by not limited to terminal voltage, charge current and/or discharge current.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An analog front-end (AFE) of an analog-to-digital converter (ADC), the AFE comprising:
   an amplifier coupled to receive an analog input signal;
   a programmable anti-aliasing filter (AAF) coupled to an output of the amplifier;
   a modulator to generate a digital data stream in response to the analog input signal;
   one or more chopping circuits, wherein the programmable AAF comprises:
      a first path between the amplifier and the modulator with an input resistance; and
      a second path between the amplifier and the modulator that bypasses the input resistance.

2. The AFE of claim 1, further comprising:
   a control circuit to control the programmable AAF to select either the first path or the second path.

3. The AFE of claim 1, wherein:
   the first path of the programmable AAF comprises:
      a first resistor coupled in series on a first line between a first output of the amplifier and a first input of the modulator;
      a second resistor coupled in series on a second line between a second output of the amplifier and a second input of the modulator;
      a capacitor couple between the first line and the second line; and
   the second path of the programmable AAF comprises a third line coupled to a first switch and a fourth line coupled to a second switch, the first switch and the second switch to bypass the first line and the second line when activated.

4. The AFE of claim 3, wherein the first path further comprises:
   a third switch coupled between the first resistor and the first output of the amplifier;
   a fourth switch coupled between the second resistor and the second output of the amplifier;
   a fifth switch coupled between the first resistor and the first input of the modulator; and
   a sixth switch coupled between the second resistor and the second input of the modulator.

5. The AFE of claim 3, wherein the programmable AAF further comprises a third path between the amplifier and the modulator that bypasses the input resistance and the capacitor of the programmable AAF.

6. The AFE of claim 1, further comprising a buffer circuit coupled to an output of the programmable AAF, wherein the modulator is a sigma-delta modulator configured to generate the digital data stream in response to an output of the buffer circuit, wherein the amplifier, the programmable AAF, the sigma-delta modulator, and the one or more chopping circuits are formed with a same integrated circuit substrate.

7. The AFE of claim 6, wherein the one or more chopping circuits comprises a plurality of chopping circuits nested within one another, including:

a first pair of chopping circuits having at least the amplifier disposed therebetween and configured to remove offset in the analog input signal, and a second pair of chopping circuits having at least the first pair of chopping circuits disposed therebetween.

8. The AFE of claim 7, wherein:
the second pair of chopping circuits include the amplifier, the programmable AAF, and the buffer circuit disposed therebetween.

9. The AFE of claim 7, wherein:
the plurality of chopping circuits further includes a third pair of chopping circuits having the buffer circuit disposed therebetween.

10. The AFE of claim 7, wherein:
the programmable AAF is configured to change analog filter element configurations during chopping operations of the first pair of chopping circuits.

11. The AFE of claim 7, further comprising:
a masking circuit configured to mask portions of the digital data stream output from the modulator during chopping operations of the first pair of chopping circuits.

12. The AFE of claim 11, wherein the masking circuit further comprises:
a memory circuit configured to store portions of the digital data stream, and
a multiplexer coupled to selectively output the digital data stream or data values stored in the memory circuit.

13. The AFE of claim 1, wherein the one or more chopping circuits comprises a plurality of chopping circuits nested within one another, including:
a first pair of chopping circuits having at least the amplifier disposed therebetween and configured to remove offset in the analog input signal,
a second pair of chopping circuits having at least the first pair of chopping circuits disposed therebetween; and
a third pair of chopping circuits disposed between the first pair of chopping circuits and having the amplifier disposed therebetween, wherein:
the first pair of chopping circuits operates at a first frequency,
the second pair of chopping circuits operates at a second frequency slower than the first frequency, and
the third pair of chopping circuits operates at a third frequency faster than the first frequency.

14. The AFE of claim 1, further comprising:
an input multiplexer (MUX) configured to selectively connect one of a plurality of input signals to the amplifier as the analog input signal, wherein the programmable AAF is configured to change analog filter element configurations in the programmable AAF when the input MUX switches between input signals.

15. A method comprising:
receiving a first analog input signal at an input;
by operation of an amplifier, amplifying the first analog input signal;
filtering a first output of the amplifier with a programmable anti-aliasing filter (AAF), the first output corresponding to the first analog input signal;
modulating a first output of programmable AAF with a modulator into a first portion of a digital data stream;
receiving a second analog input signal at the input;
by operation of the amplifier, amplifying the second analog input signs signal;
bypassing filtering a second output of the amplifier with the programmable AAF, the second output corresponding to the second analog input signal;
modulating a second output of the programmable AAF with the modulator into a second portion of the digital data stream; and
chopping analog signals at locations between the input and the modulator with one or more chopping circuits.

16. The method of claim 15, further comprising:
changing programmable AAF analog filter element configurations during chopping operations of the one or more chopping circuits.

17. The method of claim 15, further comprising buffering an output of the programmable AAF with a buffer circuit, wherein chopping analog signals comprises:
chopping the first analog input signal at the input of the amplifier and the output of the buffer with a first pair of chopping circuits; and
chopping the first analog input signal at the input of the amplifier and the output of the amplifier with a second pair of chopping circuits.

18. The method of claim 17, wherein chopping analog signals further comprises:
chopping the first analog input signal at the input of the amplifier and the first output of the amplifier with a third pair of chopping circuits nested within the second pair of chopping circuits; wherein:
the first pair of chopping circuits operates at a first frequency;
the second pair of chopping circuits operates at a second frequency faster than the first frequency; and
the third pair of chopping circuits operates at a third frequency faster than the second frequency.

19. The method of claim 15, further comprising:
masking portions of the digital data stream output from the modulator during chopping operations of the one or more chopping circuits.

20. The method of claim 15, further comprising:
selectively connecting the first analog input signal and the second analog input signal to the input as an analog input by operation of an input multiplexer (MUX); and
changing programmable AAF analog filter element configurations when the input MUX switches between the first analog input signal and the second analog input signal.

21. A system comprising:
an analog front end (AFE) that comprises:
an amplifier coupled to receive an analog input signal;
a programmable anti-aliasing filter (AAF) coupled to an output of the amplifier;
a modulator to generate a digital data stream in response to the analog input signal; and
one or more chopping circuits, wherein the programmable AAF comprises:
a first path between the amplifier and the modulator with an input resistance; and
a second path between the amplifier and the modulator that bypasses the input resistance; and
at least one sensor configured to generate the analog input signal.

22. The system of claim 21, wherein:
the at least one sensor includes a plurality of sensors;
the AFE further comprises an input multiplexer (MUX) configured to selectively connect one of the sensors to the amplifier, wherein the programmable AAF is configured to change analog filter element configurations when the input MUX switches from one sensor to another sensor.

23. The system of claim 21, wherein:
the at least one sensor is a battery current sensor.

24. The system of claim 21, wherein:
the one or more chopping circuits comprise:
- a first chopping circuit pair operating at a first frequency, and
- a second chopping circuit pair disposed within the first chopping circuit pair operating at a second frequency that is faster than the first frequency.

25. The system of claim 24, wherein:
the programmable AAF is configured to bypasses the input resistance during chopping transitions of the first chopping circuit pair.

26. The system of claim 24, wherein the AFE further comprises a masking circuit configured to mask portions of the digital data stream from the modulator during chopping operations of the first chopping circuit pair.

\* \* \* \* \*